United States Patent [19]

Bollinger et al.

[11] Patent Number: 5,688,415

[45] Date of Patent: Nov. 18, 1997

[54] LOCALIZED PLASMA ASSISTED CHEMICAL ETCHING THROUGH A MASK

[75] Inventors: David Bollinger; Jim Nester, both of Ridgefield, Conn.

[73] Assignee: Ipec Precision, Inc., Bethel, Conn.

[21] Appl. No.: 453,037

[22] Filed: May 30, 1995

[51] Int. Cl.$^6$ ............................................. B23K 10/00
[52] U.S. Cl. .................... 219/121.41; 219/121.52; 219/121.43; 156/643.1; 437/974
[58] Field of Search ............... 219/121.43, 121.44, 219/121.45, 121.52, 121.41; 437/21, 62, 63, 974; 364/474.3, 474.25; 156/630, 643.1, 646.1

[56] References Cited

U.S. PATENT DOCUMENTS

| | | | |
|---|---|---|---|
| 4,326,330 | 4/1982 | Le Page et al. | 29/578 |
| 5,254,830 | 10/1993 | Zarowin et al. | 219/121.43 |
| 5,258,323 | 11/1993 | Sharma et al. | 437/63 |
| 5,291,415 | 3/1994 | Zarowin et al. | 364/474.3 |
| 5,344,524 | 9/1994 | Sharma et al. | 156/630 |

Primary Examiner—Mark H. Paschall
Attorney, Agent, or Firm—Ware, Fressola, Van Der Sluys & Adolphson LLP

[57] ABSTRACT

A system for the formation of circuit patterns on a large flat panel display (78) using plasma assisted chemical etching to achieve a uniform or controllably nonuniform etch depth over the entire area of the display. An overlying film (60) is provided on a large flat panel display substrate (12) with a photolithographic mask (62) overlying the film and having a predetermined pattern of openings (64) therethrough. The substrate is placed adjacent a plasma etching tool which has a projected area which is smaller than the area of the surface of the substrate. The etching tool is scanned across the surface of the substrate to transfer the pattern of the photolithographic mask into the film on the surface thereof. Thereafter, the photolithographic mask is removed from the surface of the overlying film. It is desirable to determine thickness profile data for the overlying film, then generate a dwell time versus position map for the overlying film and remove material from the exposed regions of the overlying film according to the dwell time versus position map. The substrate may be glass and the film may be silicon in either the amorphousr or polycrystalline states.

8 Claims, 2 Drawing Sheets

LOCALIZED PLASMA ASSISTED CHEMICAL ETCHING THROUGH A MASK

BACKGROUND OF THE INVENTION

1. Field of the Invention

The present invention relates generally to the formation of circuit patterns on a large flat panel display, and more specifically, to the use of plasma assisted chemical etching to achieve a uniform or controllably non-uniform etch depth over the entire area of the display.

2. Description of the Prior Art

Plasma etching is currently used to form circuit patterns in the fabrication of Flat Panel Displays (FPDs). Of the various FPD types, at this time, active matrix liquid crystal displays (AMLCDs) are the furthest along in mass production: plasma etching is used to pattern the thin film transistors used to switch the liquid crystal polarizing elements. Present approaches attempt to implement this etching on a "whole panel" basis, wherein the entire area is subjected to etching simultaneously. As the flat panel display (FPD) industry moves toward fabricating several smaller FPDs from one very large (>1 square meter) panel to reduce costs, these "whole panel" etching approaches will experience great difficulty in maintaining adequate etch rate uniformity over the panel, resulting in fabrication yield losses.

The plasma assisted chemical etching (PACE) process can produce uniform plasma etching over very large areas by maintaining a uniform rate of relative motion between the FPD and a plasma electrode much smaller in area than the FPD during etching. Further, this relative motion rate can, if needed, be controlled to produce precisely non-uniform etching to compensate for measured thickness nonuniformities in the silicon film deposited an the FPD. Typical of the prior art relating to the PACE process are the inventors' commonly assigned patents: U.S. Pat Nos. 5,238,532 (Method and Apparatus for Removal of Subsurface Damage in Semiconductor Materials by Plasma Etching), 5,290,382 (Methods and Apparatus for Generating a Plasma for "Downstream" Rapid Shaping of Surfaces of Substrates and Films), and 5,291,415 (Method to Determine Tool Paths for Thinning and Correcting Errors in Thickness Profiles of Films).

Present plasma etching systems used to fabricate FPDs are limited to the fabrication of displays with maximum linear dimensions near 30 cm. Furthermore, present plasma etch systems are not easily scalable to larger panel sizes because of the difficulty in maintaining a uniform etch rate profile over the panel as their RF electrode sizes grow to match the panel sizes. Additionally, their etch rate profiles cannot be readily adjusted to achieve controllably non-uniform etching across a particular panel to compensate for film thickness non-uniformities in the deposited silicon films.

In another patent of the inventors and also commonly assigned, U.S. Pat. No. 5,254,830 (System for Removing Material from Semiconductor Wafers Using a Contained Plasma), the application is to thin a film or layer to a specified thickness and to bring the thickness profile to a desired profile, usually a uniform thickness profile. The system used to obtain the layer profiling comprises a small plasma etching tool that is scanned over the surface of the film with programmed motion to yield the final target thickness profile.

SUMMARY OF THE INVENTION

It was in light of the prior art as just described that the present invention was conceived and has now been reduced to practice. This invention relates to the application of the PACE technology to transferring patterns into a layer on, or into the surface of, a substrate. The patterns for transfer are most commonly defined by an optical lithographic process. In this application, PACE is used in conjunction with a photolithographic process to create FPD pattern elements such as the silicon transistors that electronically switch the liquid crystal polarizing elements in AMLCDs. The novelty of PACE in this application lies in its ability to maintain excellent etch rate uniformity over the large areas of present and future FPDs, and its ability to controllably produce different etch depths at many locations across the FPD.

The invention comprises: (1) a stage for supporting the FPD panel to be etched, (2) an RF-powered electrode assembly that confines the plasma to an area significantly smaller (typically 5 to 100 mm in diameter) than that of the panel, (3) means for maintaining a small (typically 1–3 mm), known spacing between the panel and electrode, (4) means for effecting relative motion between the panel and electrode assembly in directions parallel to the plane of the panel, (5) gaseous species capable of etching the silicon (or other) films deposited on the panel when converted into a plasma under the influence of an RF power supply, (6) a chamber large enough to contain the panel, stage, and electrode assembly, while allowing sufficient room for effecting their relative motions and to contain the reactive gases and prevent contamination of the panel by unwanted agents during etching, (7) means for achieving and maintaining the pressure in the chamber in the range of 1 mtorr to 100 torr, while removing gaseous etch reaction products and unreacted etch gases, (8) means for controlling the flow rate of etching reaction gases in the range of 0.1 sccm to 1,000 sccm, (9) a programmable controller to control the rate (acceleration and velocity) of relative motion between the panel and electrode assembly as a function of position on the panel, (10) software (computer program algorithms) to cause the controller to effect this relative rate of motion versus panel position to achieve the desired etch depth profile across the panel, and (11) other standard components (power supplies, gas tanks, vacuum pumps, valves, and the like) needed to support the operation of this invention.

In practice, the invention would be operated as follows. An FPD panel comprising a glass substrate sequentially coated with thin films (e.g., indium tin oxide and silicon either in amorphous or polycrystalline states) and photoresist would be introduced into the etching chamber. The photoresist film will have been previously "patterned" by standard photolithographic techniques to create small openings to the underlying silicon film in specific areas to be etched. In a production mode, a load-lock configuration would be preferable for loading the FPD panel into the etching chamber to eliminate the time required to sufficiently evacuate and control the background gases (e.g., water vapor). In this configuration, the FPD panel or set of panels would first be placed in a small, "load-lock" chamber at atmosphere with the etching chamber sealed from the load-lock by a load-lock valve (e.g., gate valve). The load-lock chamber would then be evacuated to a pressure lower than the operating pressure of the etching chamber. The load-lock valve would be opened and an FPD panel transported into the etching chamber and placed on the substrate table adjacent to the plasma tool. The reactive gases will then be introduced into the chamber at a predetermined input flow rate, while maintaining flow through the chamber and into a vacuum pump. The gases will be chosen to effect high rates of silicon etching (e.g., >10 µm/min. normal to the FPD surface) and low rates of etching for both the photoresist and transparent electrode materials (i.e., high etching selectivity.) The total pressure in the chamber will then be adjusted to a predetermined level by adjusting the rate of gas flow exiting the chamber with, e.g., a valve placed between the chamber and vacuum pump.

At that point, the RF power to the electrode assembly will be turned on, usually with the electrode assembly located just beyond an edge of the FPD panel. After allowing a short time for the RF power level and plasma beneath the electrode assembly to stabilize, the control computer will initiate a predetermined pattern of relative motion of the electrode assembly over the FPD panel, e.g., a raster or linear scan and step pattern. The electrode assembly will then be moved over the FPD panel under computer control at predetermined relative velocities until the regions of silicon exposed through the photoresist openings have been completely etched away to the underlying transparent electrode film. When all such regions have been thusly etched, the electrode assembly will be moved beyond the edge of the FPD panel, and the RF power will be turned off (extinguishing the plasma).

Finally, the etched FPD panel will be removed to the load-lock chamber and the next panel to be etched placed on the substrate table. Depending on the etch process and gasses used, the reactive gas input may or may not be maintained in the etching chamber while exchanging FPD panels. After the exchange, the load-lock chamber would then be sealed from the etching chamber by the load-lock valve. The load-lock chamber could then be brought up to atmospheric pressure and the etched FPD, or set of etched FPDs, removed and an unetched FPD panel, or panels, placed into the load-lock.

Several possible operating modes are envisioned in this application. If the thickness profile of the film (e.g., silicon) deposited on the FPD panel is sufficiently known (i.e., the deposition process is well characterized and reproducible), and if the instantaneous silicon etch rate beneath the electrode assembly is similarly known, the panel may be adequately etched by simply controlling the amount of time spent etching each panel location (i.e., the dwell time of the plasma at each panel location). In general, the silicon film thickness profile will not be adequately known. In those cases, two operating modes are possible. First, some means of detecting the completion of silicon etching (so called end point detection) at each panel location may be employed to feed information to the system controller to direct the plasma electrode to quickly pass over those locations on subsequent electrode scan passes, while dwelling for longer periods over those areas that have not yet been completely etched. The FPD panel would have been completely etched when all panel areas are detected to have reached their etching end points.

Finally, the etching system could be operated in much the same manner as now occurs in the plasma etch thinning of silicon-on-insulator (SOI) wafers. The thickness profile of the silicon film on the panel would first be accurately measured by, for example, a version of the multi-wavelength spectral reflectometer used with SOI wafers. The photoresist layer would next be applied and lithographically patterned, then the PACE system would be directed to remove the exact thickness of material previously measured at each local across the panel. To ensure that all of the silicon has been removed from the patterned areas, it may be necessary to purposely program the PACE system to over-etch each location by some small amount (e.g., 10%) as is commonly done in the etch fabrication of integrated circuits. When used in this mode, the system, including the film thickness metrology tool, could serve to permit the relaxation of silicon film thickness uniformity specifications during the film deposition process.

Two key differences between the present invention and the conventional plasma approach for pattern transfer from a mask pattern are the size of the plasma "tool" relative to the FPD substrate and that the substrate is etched with programmed tool motion. Conventional plasma etch systems are designed to etch the entire substrate simultaneously while this application specifically etches an area of the substrate that is intentionally smaller than the substrate. Pattern transfer over the entire substrate is obtained by scanning the small plasma tool over the substrate. The plasma tool motion is programmed specifically for the film and pattern characteristics of each substrate. Input to the algorithm that computes the programmed motion explicitly includes the target, thickness profile map of the thin film to be patterned (e.g., uniform thickness or measured thickness profile). Key advantages include:

(1) scale-up to very large substrates is a straight forward change in the travel of the substrate-to-plasma reactor motion control system and in the size of the vacuum chamber to enclose the motion system. Scale-up of the conventional, whole substrate, approach, on the other hand, requires a major development effort in controlling plasma parameters over a very large area;

(2) Variations in the thickness of the deposited film to be patterned can be accounted for by programmed motion of the plasma tool, that is, the tool spends less time over an area where the layer is thinner. In this way, the entire pattern can be cleanly etched without over-etching into the underlying layer. To do this, information on the starting film thickness profile would be needed. This could be obtained from direct measurement of the film thickness profile or from the known characteristic deposition profile of the deposition tool used to make the film;

(3) Pattern geometry induced removal rate variation can be compensated for by programming the tool motion. The area of exposed material being patterned can locally affect the removal rate; this will depend on the material being patterned and the plasma chemistry. This pattern dependent, localized etch rate dependence is commonly referred to a "load effect" dependence; and (4) Finally, when etching is near completion, real-time process feed-back can be used to remove any remaining areas of the layer being patterned without over-etching areas already cleared. The real-time feed-back signal can be obtained by monitoring an optical excitation line that is emitted by the plasma and is characteristic of the layer being etched. By recording the intensity of this spectrographic signal as a function of the plasma tool position, any remaining areas material to be removed can be mapped out. In a following pass over the FPD substrate, the plasma tool can then be directed to dwell longer over the areas where there is remaining material and move rapidly over areas already cleared.

Also, the present invention differs from U.S. Pat. No. 5,254,830, mentioned above, in that the present invention is concerned with making micro patterns over a very large area through transfer of a photographically defined mask pattern into an underlying film rather than thinning a film to obtain a target thickness profile. Compared to the semiconductor film thinning application (of U.S. Pat. No. 5,254,830), the PACE hardware used for the FPD pattern application of the present invention would likely have a motion control stage that holds a larger substrate and a correspondingly larger vacuum chamber.

Accordingly, it is a primary object of the present invention to form circuit patterns on a large flat panel display.

Another object of the invention is to form such circuit patterns on a large flat panel display by using plasma assisted chemical etching to achieve a uniform or controllably non-uniform etch depth over the entire area of the display.

A further object of the invention is to provide an overlying film on a large flat panel display substrate, a photolithographic mask overlying the film and having a predetermined pattern of openings therethrough, place the large flat panel display substrate adjacent a plasma etching tool which has a projected area which is smaller than the area of the surface of the flat panel display substrate and then scan the etching tool across the surface of the large flat panel display substrate to transfer the pattern of the photolithographic mask into the film on the surface of the large flat panel display substrate, and thereafter remove the photolithographic mask from the surface of the overlying film.

Still another object of the invention is to determine, for such a procedure, thickness profile data for the overlying film, then from the thickness profile data, generate a dwell time versus position map for the overlying film and remove material from the exposed regions of the overlying film according to the dwell time versus position map so generated.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and, together with the description, serve to explain the principles of the invention in general terms. Like numerals refer to like parts throughout the disclosure.

DETAILED DESCRIPTION OF THE PREFERRED EMBODIMENTS OF THE INVENTION

Figure 1:
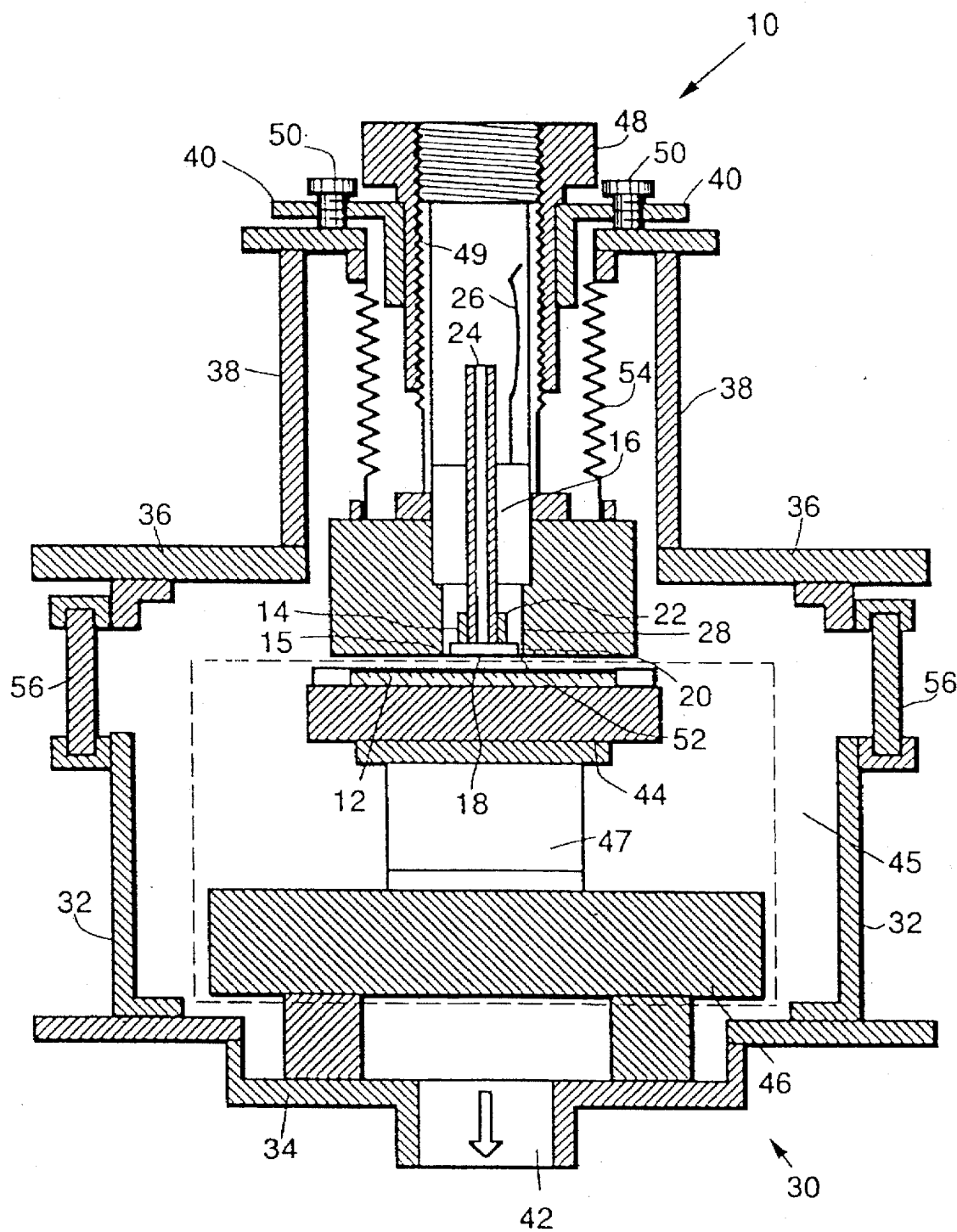
FIG. 1 is a diagrammatic elevation view, in section, of a reactor system employed for the present invention and capable of confining a plasma etch region to a local area on a substrate.

Turn now to the drawings and, initially, to FIG. 1. The method and apparatus of the present invention is directed to the formation of silicon transistors on large flat panels displays. To this end, plasma assisted chemical etching is used to achieve a uniform or controllably non-uniform etch depth over the entire area of the panel. FIG. 1 illustrates a plasma assisted chemical etching reactor 10 used for this purpose.

Referring to FIG. 1, the PACE apparatus of the invention is designed so as to confine a plasma etch region over a substrate. It comprises a reactor 10 designed for transporting a process gas into a region over the surface of a substrate where an RF field is applied to disassociate the gas into reactive components. To accomplish this desired result, the reactor 10 has a plasma chamber 14 having dielectric RF insulating walls 15 positioned by a dielectric insulator 16 and a ceiling 18 defined by a reactive gas diffuser 20. The plasma chamber 14 is the center of etching reactivity and, thus, the dielectric wall 15 must be fabricated from a non-contaminating material. Above the chamber 14, an RF driven electrode 22 is affixed between the diffuser 20 and the insulator 16. The electrode and diffuser may be the same part. A process gas feed tube 24 running centrally through the first dielectric insulator 16 supplies reactive gas to the diffuser 20 in the plasma chamber 14 during the etching operation. An RF inlet conductor 26 connects the RF driven electrode 22 to an RF field power source. A second dielectric insulator 28 surrounds the first insulator 16 and is dimensioned so as to prevent plasma formation outside of chamber 14. The components of the reactor 10 are enclosed in a vacuum housing 30 comprising a first set of walls 32 extending from a base 34 to a mid-ceiling 36 and a second set of walls 38 extending to a top ceiling flange 40.

In an exemplary embodiment, the reactive gas diffuser 20 is electrically conductive and fabricated from porous silicon carbide, graphite, or the like. In the case of etching silicon, the reactive gas has high electro-negativity and may include sulfur hexafluoride or nitrogen trifluoride, or the like. During operation. a vacuum is applied through a vacuum outlet 42 at the bottom of the vacuum housing 30. The etchable substrate 12, located adjacently below the plasma chamber 14 during etching, is supported by a substrate holder 44 which also acts as a second electrode having its potential preferably at electrical ground. The substrate holder may also have a means (not shown) to control the temperature of the substrate thereon.

The substrate holder 44 is mounted to an apparatus 45 for two-dimensional translation which allows precise placement and dwell time for the localized etching reaction on the surface of the substrate 12. In one embodiment, the apparatus 45 includes an X-Y positioning table, shown in FIG. 1 at 46 and 47 as for example, the reference numeral 46 indicating the X direction track and the reference numeral 47 indicating the Y direction track of travel and wherein the X and Y directions are orthogonal. The reactor 10 has a threaded tube 48 connected to a reactor support means 49 which interfaces with the threaded tube. The tube 48 may be rotated in a clockwise or counter clockwise fashion so as to allow adjustment of the distance between the plasma chamber 14 and the surface of the substrate 12. In the embodiment illustrated, the distance between the plasma chamber and the substrate may be adjusted in the approximate range of 1 to 10 mm. The reactor also has kinematic mounting means having three screws 50 equally spaced on a circle, each of which nest into a V-groove (not shown) on the top ceiling flange 40. This mounting means allows adjustment of the angle of the terminal end 52 of the plasma chamber with respect to the surface of the substrate 12. While the embodiment described above provides a means for positioning the plasma chamber 14 with respect to the surface of the substrate 12, other adaptations such as permanently fixing the plasma chamber assembly and providing three-dimensional and multi-angular positioning of the substrate by a three dimensional and multi-angular translation stages may be readily substituted. In fact, one preferred embodiment has a fixed reactor configuration so that the RF power, gas and coolant to the plasma reactor can be easily interfaced at atmosphere.

The reactor system further comprises a bellows 54 attached between the ceiling flange 40 of the vacuum housing 30 and the second dielectric insulator 28 so as to provide a means for vacuum sealing the reactor 10 while the plasma chamber assembly is allowed relative movement within the reactor. A plurality of viewports 56 are provided for observation of the reaction.

The plasma etch reaction is primarily chemical. Chemically reactive species generated from the feed gas by the RF driven plasma interact with the substrate surface to form volatile by-products that are pumped from the system. The present invention achieves such a mechanism by using a relatively high pressure (greater than 1 Torr) in the plasma etching tool. A high pressure regime is preferred but not necessary because it: (1) prevents subsurface damage from high energy ions; and (2) provides a high removal rate. The relatively high pressure assures that the ion motion is dominated by collisions with neutral gas molecules and, thus, the energy of the ions striking the substrate is limited to several electron volts. Ion energies greater than approximately 30 electron volts are necessary to create subsurface damage. Although the ion energy is low with the method and apparatus of the present invention, the chemical reaction rate is accelerated by the very low energy ions which by themselves could not remove material. In addition to ensuring a collision dominated removal mechanism through the use of a high pressure plasma region, the use of a high pressure plasma also generates a beneficial higher density of reactive species at the active etching site. The benefit of a higher density of reactive species is the increase in the material removal rate at the etching site. For this invention, relative to the standard etch system that etches the entire substrate simultaneously in a large plasma, a locally high etch rate is needed to obtain comparable throughput.

Flat panel displays (FPDs) are devices for displaying electronically transmitted information in a visual format easily understood by humans. They function much as the familiar cathode ray tube (CRT) devices on common television sets, but are more compact, lightweight, and consume less power then CRTs. All FPDs share several common characteristics: (1) a medium that can be made to alter its visible light transmission, reflection, or emission properties under the influence of an applied electrical signal; (2) means for distributing that medium into an array of discrete elements, each with dimensions less than the resolution of the naked eye, i.e., a few micrometers; and (3) means for selectively applying an electrical signal to each of those discrete elements. This invention applies to processes used to form the discrete elements and the means for producing selective electrical signals on FPDs. The following describes a particular embodiment of the invention, the formation of the electrical switching elements in so-called active matrix liquid crystal displays (AMLCDs).

Figure 2:
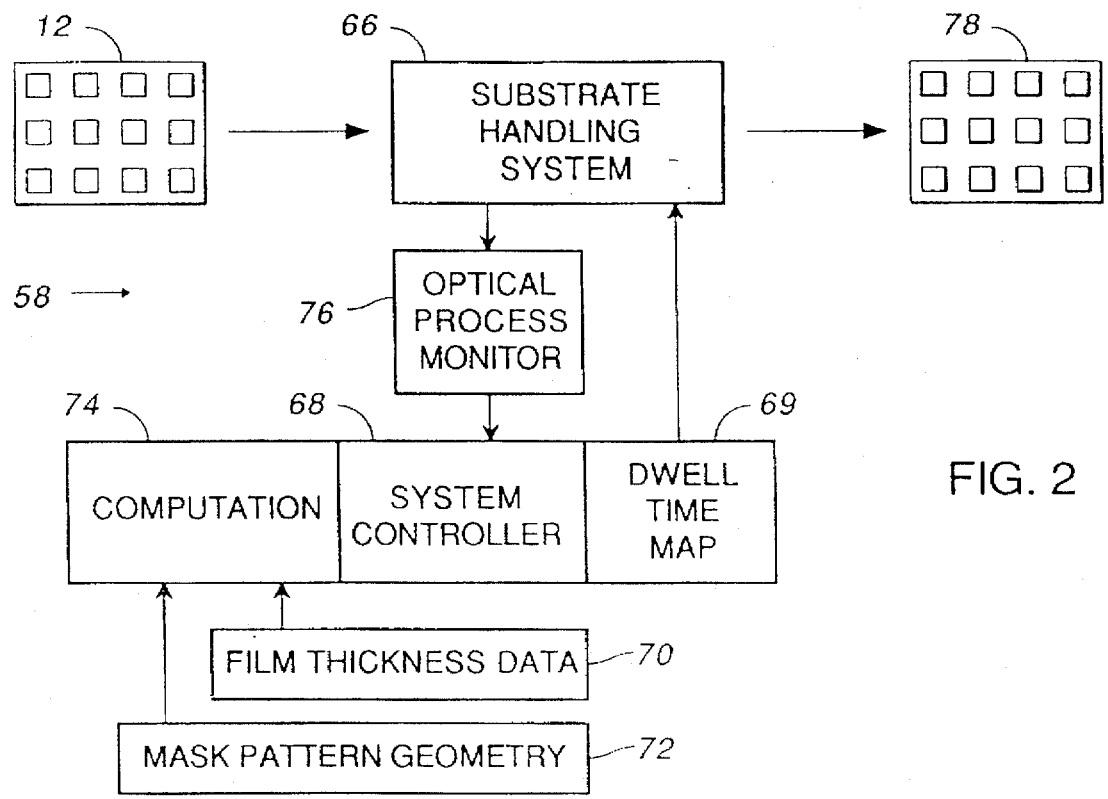
FIG. 2 is a schematic representation depicting components of the present invention and indicating the process of the invention.
Figure 3:
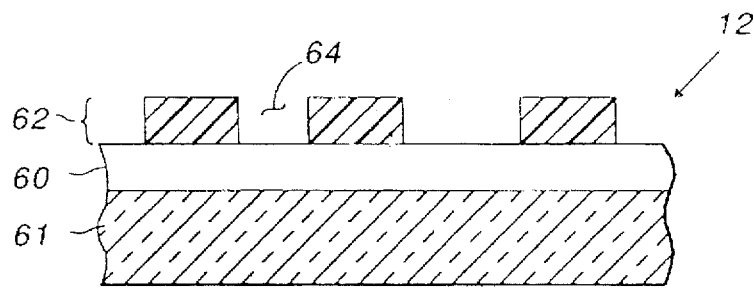
FIG. 3 is a cross-section of a substrate prior to etching in accordance with the invention.
Figure 5:
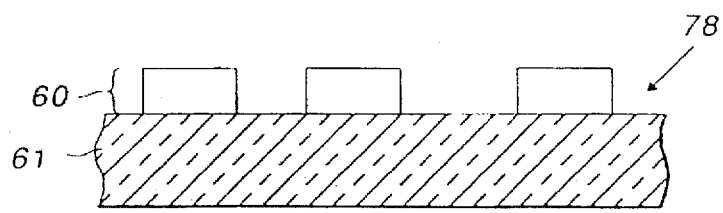
FIG. 5 is a cross-section of a substrate after the photomask is removed.

FIG. 2 is a diagrammatic representation of a substrate patterning system according to the invention which, as previously noted, relates to a system for producing large flat panel displays from display substrate 12. According to the invention, as illustrated in FIG. 5, substrate 61, which may be glass, is suitably provided with an overlying film 60 comprised of one or more layers of a transparent electrode material, indium tin oxide being one typical material and silicon in either the amorphous or polycrystalline states being another typical material. A photolithographic mask 62 such as photoresist overlies the film 60 and has a predetermined pattern of openings 64 therethrough for creating small openings in the underlying film 60 in the specific areas to be etched.

Thereupon, a substrate handling system 66 is suitably operated to position the large flat panel display substrate 12 as defined above adjacent the plasma etching tool defined by the plasma chamber 14 which has a projected area which is smaller than the area of the surface of the substrate. The etching tool is scanned across the surface of the substrate to transfer the pattern of the photolithographic mask 62 into the film 60 on the surface of the substrate. The scanning operation is controlled by a system controller 68 which comprises hardware and software to control the execution of a calculated dwell-time map 69 by the substrate handling system, input and output of substrates, and system operating parameters.

A subsystem 70 provides film thickness data as an input to the controller 68. Measurements may be taken after deposition of the film 60 onto the substrate or be given as a result of characterization of the film deposition system. The film thickness data can relate a uniform thickness or a map of thickness variation that will be accounted for in executing the plasma removal.

Similarly, a subsystem 72 provides mask pattern geometry as an optional input to the system controller 68. It can allow the software algorithm to compute the plasma removal dwell map to account for localized film etch rate differences resulting from the mask pattern geometry for example, the fraction of film exposed by the mask.

Computation hardware and software is depicted at 74 comprising a computer and algorithms that generate the plasma dwell-time versus position map for the plasma reactor 10 to etch through the film 60 to be patterned without a degrading over-etch. Computation may have the ability to make real time corrections to the plasma tool dwell-time map based on input from an optical process monitor 76.

The dwell-time map 69 is a plasma reactor dwell-time versus position map that is executed as a velocity versus position map by a programmed scan path of the plasma reactor. This map may be updated in real time based on input from the optical process monitor 76. It is noteworthy that having as input the shape of the plasma tool material removal pattern, the algorithm used to compute the dwell-time map can provide for variations in removal over distances that are less than the size of the plasma tool. The plasma tool can then correct for spatial variations, as could result from the mask geometry, that are a fraction (e.g., ⅕) of the tool diameter. The algorithm to optimize the dwell-time map to make such corrections can be quite complex but the physical basis for this procedure is straight forward. The amount of material removal at any point on the substrate is a summation of the material removed by the plasma tool in a succession of scans in which that point falls anywhere in the scan path of the tool. Successive scans, in general, are offset. By using small offsets, the plasma tool can remove material from one location while removing little from a neighboring location less than a tool diameter away.

The optical process monitor 76 is suitably provided to monitor the removal process in real time. The plasma may be optically monitored to provide a feedback signal that can be used to: (1) maintain a constant etch rate of the film being patterned; and (2) determine time of actual etching through to the underlying layer (that is, the "end point" of the removal) allowing correction of the dwell map being executed for remaining thickness variation in the film being etched.

Figure 4:
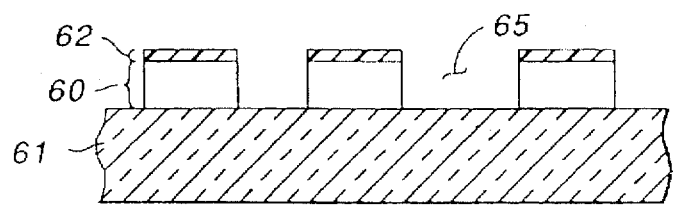
FIG. 4 is a cross-section of a substrate after etching in accordance with the invention.

After the mask pattern has been transferred into the film to be patterned (FIG. 4), the remaining mask material is stripped from the surface of the overlying film (FIG. 5). A resulting patterned substrate 78 is depicted in FIGS. 2 and 5.

Although the present invention has been described herein with respect to one or more particular embodiments, other configurations and arrangements can be made without departing from the scope of this invention.

What is claimed is:

1. A method for plasma assisted, chemical etching through a mask having apertures in a predetermined pattern, said method comprising the steps of:

applying the mask to a substrate;

positioning the mask adjacent a plasma etching tool that has an electrode that is smaller in area than the area of the mask;

producing a plasma glow discharge adjacent said electrode; and moving the plasma etching tool relative to the substrate to transfer the pattern of the mask to the substrate.

2. The method as set forth in claim 1 wherein said moving step includes the step of moving the plasma etching tool relative to the substrate at a non-uniform rate to compensate for loading effects.

3. The method as set forth in claim 1 wherein said moving step includes the step of moving the plasma etching tool relative to the substrate at a non-uniform rate to compensate for non-uniformities in the flatness of the substrate.

4. The method as set forth in claim 1 wherein said display substrate includes a film underlying the mask and the film is to be etched through and wherein said method includes the steps of:

determining when the film is etched through; and terminating said plasma glow discharge.

5. The method as set forth in claim 4 wherein said determining step includes the steps of:

monitoring the optical emission of the plasma glow discharge for changes in emission; and using a predetermined change in emission as indicative of the film being etched through.

6. The method as set forth in claim 4 wherein said moving step includes the step of moving the plasma etching tool relative to the substrate at a non-uniform rate to compensate for loading effects.

7. The method as set forth in claim 4 wherein said moving step includes the step of moving the plasma etching tool relative to the substrate at a non-uniform rate to compensate for irregularities in the flatness of the film.

8. The method as set forth in claim 4 wherein said moving step includes the step of moving the plasma etching tool relative to the substrate at a non-uniform rate to compensate for non-uniformities in the thickness of the film.

* * * * *